United States Patent
Kang

(10) Patent No.: US 9,601,590 B2
(45) Date of Patent: Mar. 21, 2017

(54) DUAL WORK FUNCTION BURIED GATE-TYPE TRANSISTOR, METHOD FOR FORMING THE SAME, AND ELECTRONIC DEVICE INCLUDING THE SAME

(71) Applicant: SK hynix Inc., Gyeonggi-do (KR)

(72) Inventor: Dong-Kyun Kang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/218,698

(22) Filed: Jul. 25, 2016

(65) Prior Publication Data

US 2016/0336414 A1 Nov. 17, 2016

Related U.S. Application Data

(62) Division of application No. 14/458,986, filed on Aug. 13, 2014, now Pat. No. 9,431,496.

(30) Foreign Application Priority Data

May 29, 2014 (KR) ........................ 10-2014-0065279

(51) Int. Cl.
| | |
|---|---|
| *H01L 21/336* | (2006.01) |
| *H01L 29/423* | (2006.01) |
| *H01L 29/51* | (2006.01) |
| *H01L 27/108* | (2006.01) |
| *H01L 21/28* | (2006.01) |
| *H01L 29/49* | (2006.01) |
| *H01L 29/66* | (2006.01) |

(52) U.S. Cl.
CPC .... *H01L 29/4236* (2013.01); *H01L 21/28088* (2013.01); *H01L 27/10823* (2013.01); *H01L 27/10876* (2013.01); *H01L 27/10891* (2013.01); *H01L 29/4966* (2013.01); *H01L 29/518* (2013.01); *H01L 29/66621* (2013.01)

(58) Field of Classification Search
CPC ................. H01L 27/14887; H01L 27/14831
USPC ................................. 257/223, 330; 438/272
See application file for complete search history.

(56) References Cited

U.S. PATENT DOCUMENTS

| | | | | |
|---|---|---|---|---|
| 8,629,494 | B2* | 1/2014 | Kim ..................... | H01L 27/105 257/334 |
| 8,716,773 | B2* | 5/2014 | Taniguchi ......... | H01L 27/10814 257/296 |
| 9,178,039 | B2* | 11/2015 | Park .................. | H01L 27/10876 |
| 2002/0135007 | A1* | 9/2002 | Koike .............. | H01L 27/10829 257/301 |

(Continued)

*Primary Examiner* — Jami M Valentine
(74) *Attorney, Agent, or Firm* — IP & T Group LLP

(57) ABSTRACT

A transistor includes: a source region and a drain region that are formed in a substrate to be spaced apart from each other; a trench formed in the substrate between the source region and the drain region; and a buried gate electrode inside the trench, wherein the buried gate electrode includes: a lower buried portion which includes a high work-function barrier layer including an aluminum-containing titanium nitride, and a first low-resistivity layer disposed over the high work-function barrier layer; and an upper buried portion which includes a low work-function barrier layer disposed over the lower buried portion and overlapping with the source region and the drain region, and a second low-resistivity layer disposed over the low work-function barrier layer.

5 Claims, 15 Drawing Sheets

(56) References Cited

U.S. PATENT DOCUMENTS

| | | | | |
|---|---|---|---|---|
| 2007/0264771 A1* | 11/2007 | Ananthan | ......... | H01L 29/42376 438/243 |
| 2008/0296674 A1* | 12/2008 | Graham | ............ | H01L 27/10876 257/334 |
| 2011/0260239 A1* | 10/2011 | Oyu | .................... | H01L 29/4236 257/330 |
| 2014/0008720 A1* | 1/2014 | Xie | ....................... | H01L 27/092 257/331 |
| 2015/0214362 A1* | 7/2015 | Oh | ...................... | H01L 29/7827 257/330 |
| 2015/0255463 A1* | 9/2015 | Ando | ............... | H01L 29/66545 257/371 |

\* cited by examiner

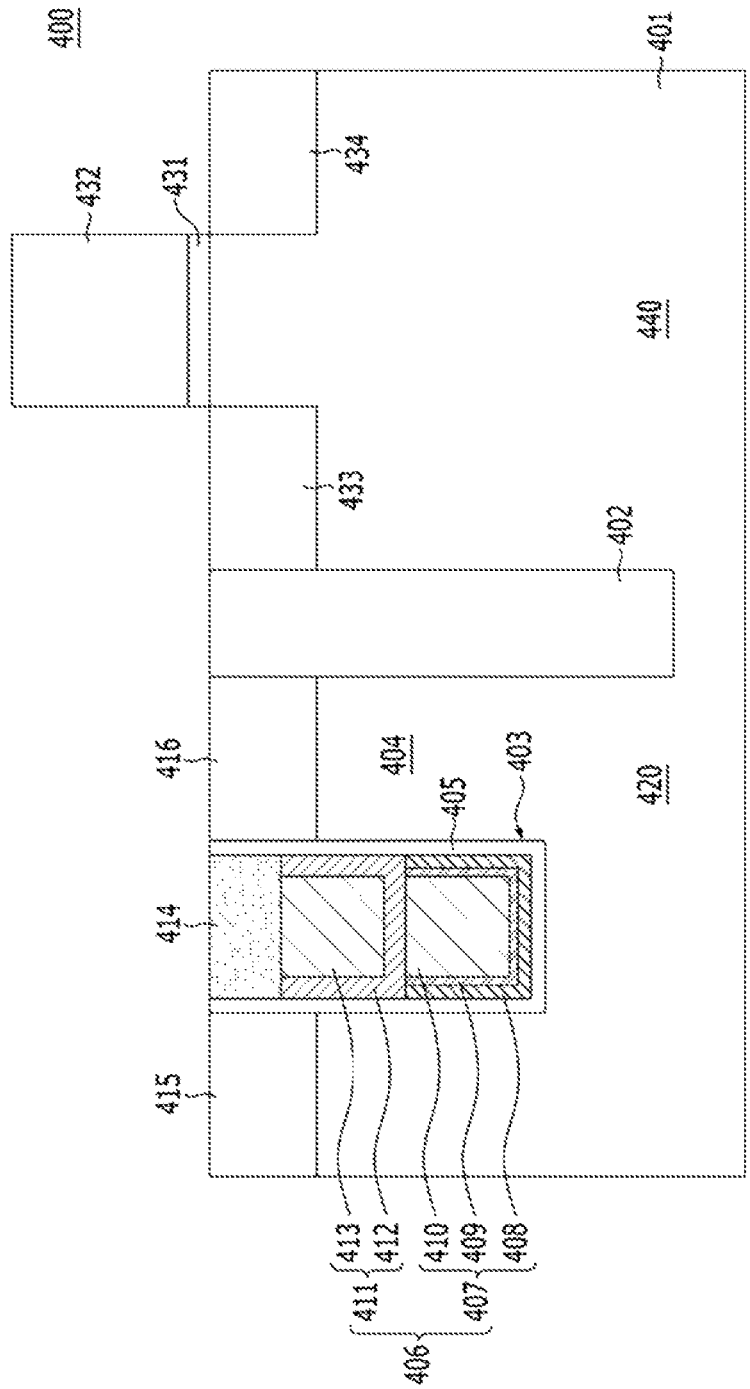

DUAL WORK FUNCTION BURIED GATE-TYPE TRANSISTOR, METHOD FOR FORMING THE SAME, AND ELECTRONIC DEVICE INCLUDING THE SAME

CROSS-REFERENCE TO RELATED APPLICATIONS

This application is a division of U.S. patent application Ser. No. 14/458,986 filed on Aug. 13, 2014, which claims priority of Korean Patent Application No. 10-2014-0065279, filed on May 29, 2014. The disclosure of each of the foregoing application is herein incorporated by reference in its entirety.

BACKGROUND

1. Field

Exemplary embodiments relate to a transistor, and more particularly, to a dual work function buried gate-type transistor, a method for fabricating the transistor, and an electronic device including the transistor.

2. Description of the Related Art

Transistors employ metal gate electrodes as their gate electrodes. Metal gate electrodes of low resistance may reduce gate resistance. Also, since the metal gate electrodes have a high work function, they may decrease channel impurity dose. This may lead to reduced leakage current, thus improving performance of transistors.

The high work function, however, has a problem in that gate-induced drain leakage (GIDL) is increased in an area where a metal gate electrode overlaps with an impurity region (for example, a source region/drain region). In particular, it is difficult to decrease the gate-Induced drain leakage in a buried gate-type transistor because there is a large area where a metal gate electrode overlaps with the Impurity regions (which includes a source region and a drain region).

SUMMARY

An embodiment is directed to a buried gate-type transistor that may improve gate-induced drain leakage (GIDL) current properties and driving capability, and a method for fabricating the buried gate-type transistor.

In accordance with an embodiment, a transistor includes: a source region and a drain region that are formed in a substrate to be spaced apart from each other; a trench formed in the substrate between the source region and the drain region; and a buried gate electrode disposed in the trench, wherein the buried gate electrode includes: a lower buried portion which includes a high work-function barrier layer and a first low-resistivity layer disposed over the high work-function barrier layer, wherein the high work-function barrier layer includes aluminum-containing titanium nitride; and an upper buried portion which includes a low work-function barrier layer which is disposed over the lower buried portion and overlapping with the source region and the drain region, and a second low-resistivity layer which is disposed over the low work-function barrier layer.

The high work-function barrier layer may include a titanium aluminum nitride (TiAlN). The low work-function barrier layer may include a fluorine-free tungsten (FFW). The low work-function barrier layer may include a titanium carbide (TiC), a titanium aluminum carbide (TiAlC), or a titanium aluminum (TiAl).

In accordance with another embodiment, a transistor includes: an active region including a fin region; an isolation layer recessed to expose an upper surface and sidewalls of the fin region; a source region and a drain region that are formed in the active region and spaced apart from each other; a trench formed in the active region between the source region and the drain region and extending to the Isolation layer; and a buried gate electrode disposed in the trench and covering the fin region, wherein the buried gate electrode includes: a lower buried portion which includes a high work-function barrier layer, and a first low-resistivity layer disposed over the high work-function barrier layer, wherein the high work-function barrier layer includes aluminum-containing titanium nitride; and an upper buried portion which includes a low work-function barrier layer which is disposed over the lower buried portion and overlapping with the source region and the drain region, and a second low-resistivity layer which is disposed over the low work-function barrier layer.

In accordance with yet another embodiment, a method for fabricating a transistor includes: forming an isolation layer that defines an active region in a substrate; forming a trench that goes across the active region and the isolation layer; forming a lower buried gate electrode that includes a high work-function barrier layer disposed on a bottom and sidewalls of the trench and fills a portion of the trench; forming an upper buried gate electrode that includes a low work-function barrier layer and fills a portion of the trench over the lower buried gate electrode; forming a capping layer over the upper buried gate electrode; and forming a source region and a drain region that are spaced apart from each other by the trench in the substrate and have a depth overlapping with the low work-function barrier layer.

BRIEF DESCRIPTION OF THE DRAWINGS

FIG. 8 is a cross-sectional view illustrating an example of a semiconductor device including a transistor in accordance with an embodiment.

DETAILED DESCRIPTION

Figure 1:
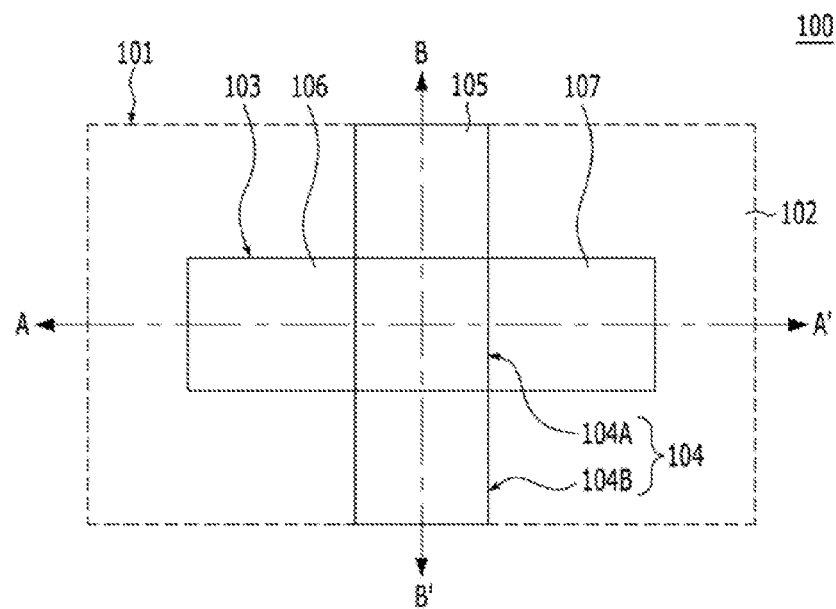
FIG. 1 is a plan view illustrating a transistor in accordance with an embodiment.

Exemplary embodiments will be described below in more detail with reference to the accompanying drawings. The embodiments may, however, be modified in different forms and should not be construed limitative. Like reference numerals refer to like parts throughout the various figures and embodiments.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a plan view illustrating a transistor in accordance with an embodiment.

Referring to FIG. 1, the transistor 100 includes a buried gate electrode 105, a first impurity region 106, and a second impurity region 107. An isolation layer 102 and an active region 103 are formed in a substrate 101. A trench 104 may be formed in the substrate 101. The trench 104 is formed across the active region 103 and the isolation layer 102. The buried gate electrode 105 is formed inside the trench 104. The trench 104 makes the first impurity region 106 and the second impurity region 107 spaced apart from each other. The trench 104 includes a first trench 104A and a second trench 104S. The first trench 104A is formed in the active region 103. The second trench 104B is formed in the isolation layer 102. The trench 104 may continuously extend from the first trench 104A to the second trench 104B.

Figure 2A:
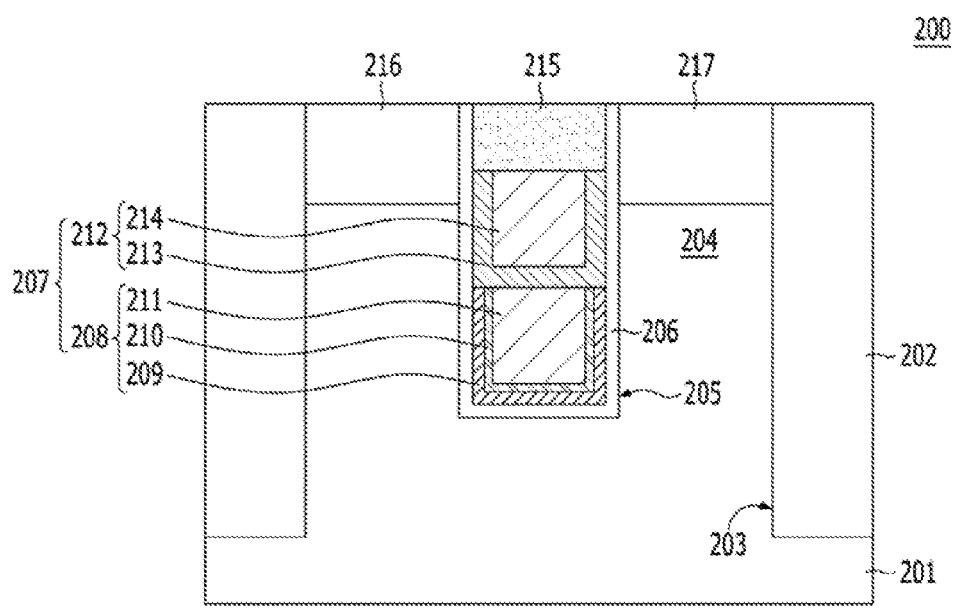
FIGS. 2A and 2B are cross-sectional views illustrating a transistor in accordance with a first embodiment.
Figure 2B:
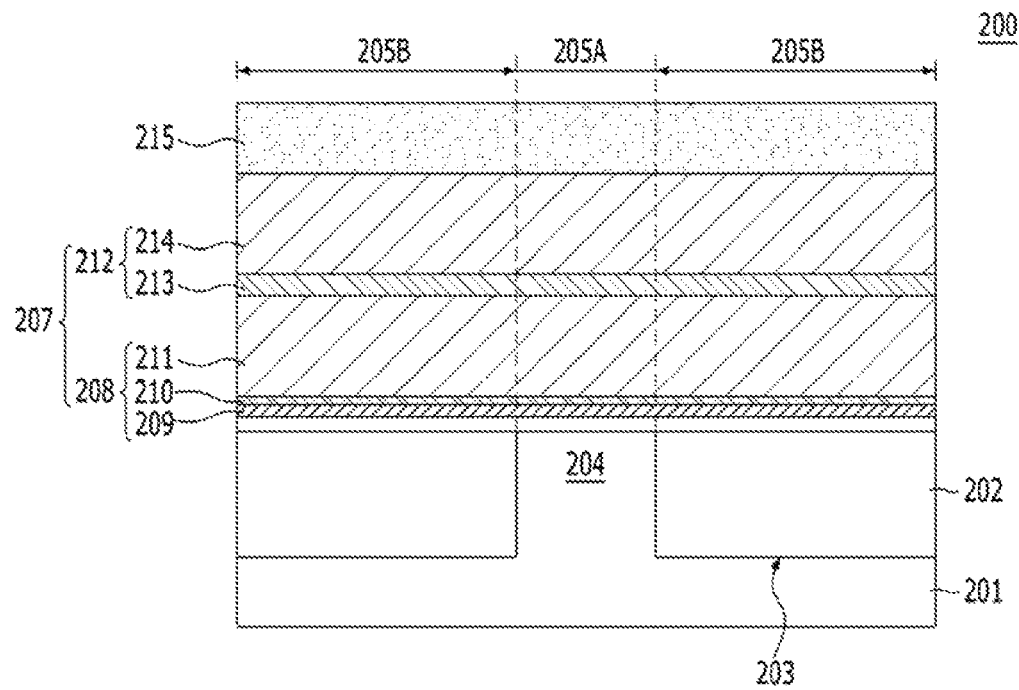

FIGS. 2A and 2B are cross-sectional views illustrating a transistor in accordance with a first embodiment. FIG. 2A is a cross-sectional view of the transistor 100 taken along a line A-A' of FIG. 1. FIG. 2B is a cross-sectional view of the transistor 100 taken along a line B-B' of FIG. 1.

A transistor 200 is formed in a substrate 201. The substrate 201 includes a semiconductor substrate. The substrate 201 may include a silicon substrate or a Silicon On Insulator (SOI) substrate. An isolation layer 202 is formed in the substrate 201. The isolation layer 202 fills an isolation trench 203. The isolation layer 202 defines an active region 204 in the substrate 201. The active region 204 may have a shape of island.

A trench 205 having a predetermined depth is formed in the substrate 201. The trench 205 may have a shape of a line extending in one direction. The trench 205 may be formed across the active region 204 and the isolation layer 202. A depth of the trench 205 may be shallower than that of the isolation trench 203. The trench 205 may include a first trench 205A and a second trench 205B. The first trench 205A is formed in the active region 204. The second trench 205B is formed in the isolation layer 202. The first trench 205A and the second trench 205S may be formed in continuum. A bottom surface of the first trench 205A and a bottom surface of the second trench 205B may be disposed at the same level.

A first impurity region 216 and a second impurity region 217 are formed in the active region 204. The first impurity region 216 and the second impurity region 217 are doped with conductive impurities. The conductive impurity may include phosphorus (P), arsenic (As), antimony (Sb), or boron (B). The first impurity region 216 and the second impurity region 217 are doped with impurities of the same conductive type. The first impurity region 216 and the second impurity region 217 are disposed in the active region 204 on both sides of the trench 205. The first impurity region 216 and the second impurity region 217 respectively correspond to a source region and a drain region. Bottom surfaces of the first impurity region 216 and the second impurity region 217 may be positioned at a predetermined depth from the top surface of the active region 204. The first impurity region 216 and the second impurity region 217 may contact sidewalls of the trench 205. The bottom surfaces of the first impurity region 216 and the second impurity region 217 may be located at a level higher than the bottom surface of the trench 205.

A gate dielectric layer 206 is formed on the bottom surface and the sidewalls of the trench 205. The gate dielectric layer 206 may include a silicon oxide, a silicon nitride, a silicon oxynitride, a high-k material, or a combination thereof. High-k material may have a relatively higher dielectric constant (k) than a silicon oxide and a silicon nitride.

A buried gate electrode 207 is formed in the trench 205. The buried gate electrode 207 may include a lower buried portion 208 and an upper buried portion 212.

The lower buried portion 208 includes a first barrier layer 209 and a first low-resistivity layer (or a lower gate electrode) 211. The first low-resistivity layer 211 fills a portion of the trench 205. The first barrier layer 209 is disposed between the first low-resistivity layer 211 and the gate dielectric layer 206. A barrier enhancement layer 210 may be disposed between the first barrier layer 209 and the first low-resistivity layer 211. The first barrier layer 209 protects the first low-resistivity layer 211 from diffusing. The barrier enhancement layer 210 enhances protection for the first low-resistivity layer 211 and prevents a reaction between the first barrier layer 209 and the first low-resistivity layer 211. Top surfaces of the first barrier layer 209, the barrier enhancement layer 210, and the first low-resistivity layer 211 may be flush with each other.

The upper buried portion 212 includes a second barrier layer 213 and a second low-resistivity layer (or an upper gate electrode) 214. The second low-resistivity layer 214 fills a portion of the trench 205 over the lower buried portion 208. The second barrier layer 213 is disposed between the second low-resistivity layer 214 and the first low-resistivity layer 211. Also, a portion of the second barrier layer 213 may be extended to be disposed between the second low-resistivity layer 214 and the gate dielectric layer 206. Top surfaces of the second barrier layer 213 and the second low-resistivity layer 214 may be flush with each other.

A capping layer 215 fills the trench 205 over the upper buried portion 212. The capping layer 215 protects the buried gate electrode 207. The capping layer 215 includes a dielectric layer. The capping layer 215 may include silicon nitride.

Hereafter, the buried gate electrode 207 is described in detail.

The first barrier layer 209 and the second barrier layer 213 are formed of materials having different work functions. The first barrier layer 209 has a greater work function than the second barrier layer 213. The first barrier layer 209 includes high work function material. The second barrier layer 213 includes low work function material. The work function value of the high work function material is greater than a mid-gap work function value of silicon. The low work function material is a material having lower work function than the mid-gap work function of silicon. To be specific, the high work function material may have a work function value higher than approximately 4.5 eV, whereas the low work function material may have a work function value lower than approximately 4.5 eV.

The first barrier layer 209 and the second barrier layer 213 include metal-containing materials of different work functions. The first barrier layer 209 may include high work function metal-containing material, and the second barrier layer 213 may include low work function metal-containing material. The first barrier layer 209 may include metal nitride, while the second barrier layer 213 may include metal, metal compound, or metal carbide. The first barrier layer 209 may contain work function adjustment material. The work function adjustment material may contain aluminum (Al). Therefore, the first barrier layer 209 may include aluminum-containing metal nitride. The aluminum-containing metal nitride has a higher work function than a metal nitride that does not contain aluminum. In an embodiment, the first barrier layer 209 may include aluminum-containing titanium nitride. The aluminum-containing titanium nitride may be referred to as a titanium aluminum nitride (TiAlN) or an aluminum-doped titanium nitride (Al-doped TiN). The aluminum-doped titanium nitride (Al-doped TiN) may be formed by depositing titanium nitride (TiN) and doping aluminum by an aluminum implantation process. The titanium aluminum nitride (TiAlN) may be formed by adding aluminum-containing source material during a deposition process where a titanium nitride (TiN) is deposited to dope the aluminum in-situ (i.e. in the same process). To take an example, when titanium nitride (TiN) is deposited by a Chemical Vapor Deposition (CVD) process, titanium source material, nitrogen-containing material, and aluminum source material are applied simultaneously.

The first barrier layer 209 modulates a threshold voltage Vt. For example, a high work function of the first barrier layer 209 increases the threshold voltage Vt. Thus, a channel impurity dose can be maintained at a low level. As a result, leakage current and refresh characteristics are improved.

The second barrier layer 213 has low work function. The second barrier layer 213 may include fluorine-free tungsten (FFW). The fluorine-free tungsten is formed using tungsten (W) source material which does not include fluorine (F). As a result, attack of the first low-resistivity layer 211 by fluorine is prevented. Also, the fluorine-free tungsten prevents the second low-resistivity layer 214 from being diffused. Moreover, since fluorine-free tungsten has lower resistivity than titanium nitride (TiN) and tungsten nitride (WN), it is advantageous in making the buried gate electrode 207 have low resistance. According to another embodiment, the second barrier layer 213 may include fluorine-free tungsten carbide (FFWC), and the work function may be controlled by adjusting carbon content. According to yet another embodiment, the second barrier layer 213 may include titanium-containing material such as titanium aluminum (TiAl), titanium carbide (TiC), and titanium aluminum carbide (TiAlC). Titanium aluminum carbide (TiAlC) may include titanium carbide (TiC) doped with aluminum.

The second barrier layer 213 may have a portion that overlaps with the first impurity region 216 and the second impurity region 217. Since the second barrier layer 213 has low work function, it is possible to prevent gate-induced drain leakage (GIDL) from occurring between the first impurity region 216 and the second impurity region 217 due to the second barrier layer 213. Meanwhile, the first barrier layer 209 does not overlap with the first impurity region 216 and the second impurity region 217.

The first low-resistivity layer 211 includes material having a lower resistivity than that of the first barrier layer 209. The second low-resistivity layer 214 includes material having lower resistivity than that of the second barrier layer 213. The first low-resistivity layer 211 and the second low-resistivity layer 214 may be formed of the same material. The first low-resistivity layer 211 and the second low-resistivity layer 214 decrease resistance of the buried gate electrode 207. The first low-resistivity layer 211 and the second low-resistivity layer 214 include low-resistivity metal-containing material. The first low-resistivity layer 211 and the second low-resistivity layer 214 may include tungsten.

The barrier enhancement layer 210 prevents the diffusion between the first barrier layer 209 and the first low-resistivity layer 211. The barrier enhancement layer 210 includes metal-containing material. The barrier enhancement layer 210 may include metal nitride. In another embodiment, the barrier enhancement layer 210 may include titanium nitride (TiN).

As described above, the lower buried portion 208 may have a stacked structure of titanium aluminum nitride/titanium nitride/tungsten (TiAlN/TiN/W), and the upper buried portion 212 may have a stacked structure of fluorine-free tungsten/tungsten (FFW/W).

The channel of the transistor 200 may be defined along the trench 205 between the first impurity region 216 and the second impurity region 217. The buried gate electrode 207 may be a dual work function buried gate electrode, as shown in FIG. 2A. The dual work-function buried gate electrode includes the first barrier layer 209 having a high work function and the second barrier layer 213 having a low work function.

Figure 3A:
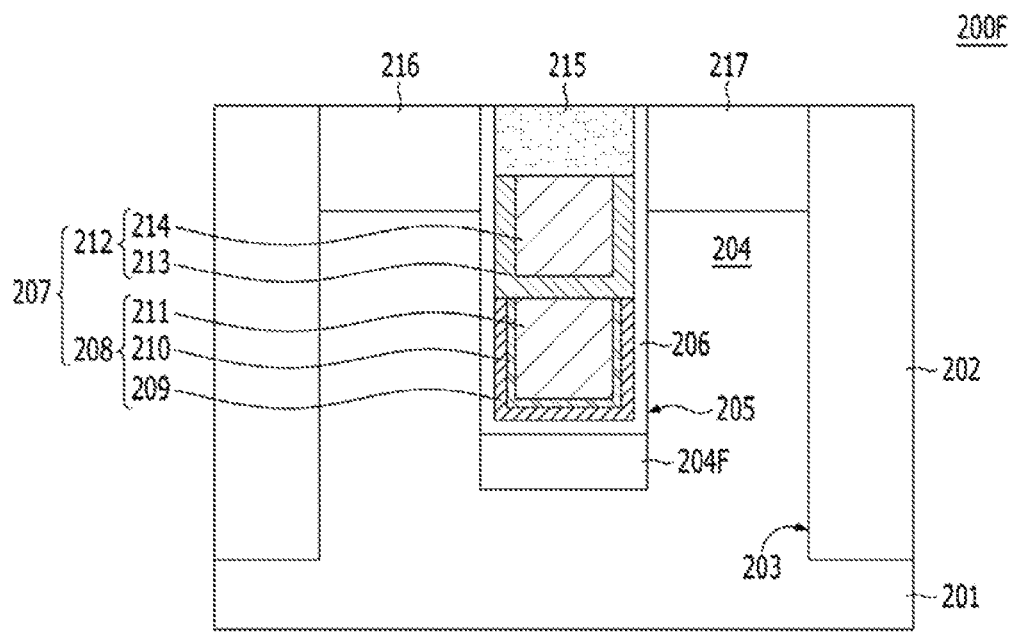
FIGS. 3A and 3B are cross-sectional views illustrating a transistor in accordance with a second embodiment.
Figure 3B:
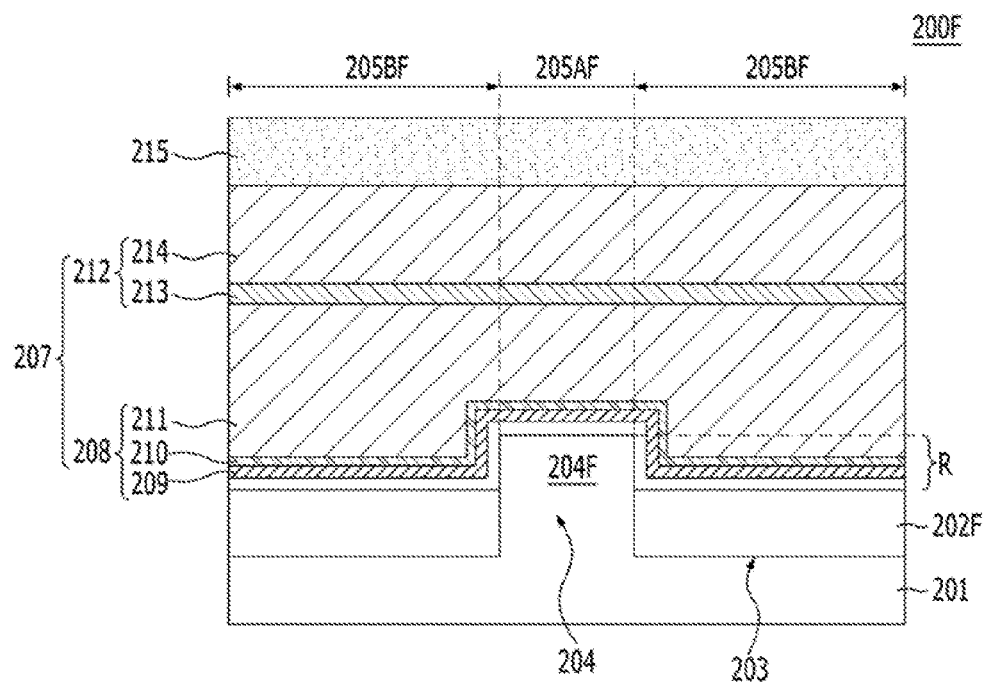

FIGS. 3A and 3B are cross-sectional views illustrating a transistor in accordance with a second embodiment. FIG. 3A is a cross-sectional view illustrating the transistor of the second embodiment taken along the line A-A' of FIG. 1. FIG. 3B is a cross-sectional view illustrating the transistor 200 of the second embodiment taken along the line B-B' of FIG. 1. Some structures of the transistor 200F of the second embodiment may be the same as those of the transistor 200 appearing in the first embodiment. Descriptions on the same structures will be omitted herein.

Referring to FIGS. 3A and 3B, a trench 205 includes a first trench 205AF and a second trench 205BF. The first trench 205AF is formed in the active region 204. The second trench 205BF is formed in the isolation layer 202. The first trench 205AF and the second trench 205BF may be formed in continuum. In the trench 205, a bottom surface of the first trench 205AF and a bottom surface of the second trench 205BF may be positioned at different levels. For example, the bottom surface of the first trench 205AF may be positioned at a higher level than the bottom surface of the second trench 205BF. The height difference between the bottom surface of the first trench 205AF and the bottom surface of the second trench 205BF is created by recessing of an isolation layer 202. Therefore, the second trench 205BF includes a recess region R having a lower bottom surface than the first trench 205AF. The recessed isolation layer 202 is denoted by a reference numeral 202F.

A step between the bottom of the first trench 205AF and the bottom of the second trench 205BF forms a fin region 204F in the active region 204. In short, the active region 204 includes the fin region 204F.

As described above, the fin region 204F is formed under the first trench 205AF, and sidewalls of the fin region 204F are exposed through the recess region R. The fin region 204F is a portion where a channel is formed. The fin region 204F is referred to as a saddle fin. The fin region 204F may increase a width of the channel and improve the electrical characteristics. The lower portion of the active region 204 except for the fin region 204F is not exposed through the recessed isolation layer 202F.

A gate dielectric layer 206 is formed on the sidewall and over the upper surface of the fin region 204F. A lower buried portion 208 covers all the sidewall and upper portion of the fin region 204F. The lower buried portion 208 is formed in the trench 205 to fill the recess region R. A cross-sectional area of the lower buried portion 208 is wider in the isolation layer 202 than in the active region 204. An upper buried portion 212 is not disposed around the sidewall of the fin region 204F. The fin region 204F is affected by a high work function of a first barrier layer 209.

The transistor 200F in accordance with the second embodiment is referred to as a buried gate-type fin channel transistor.

According to the first embodiment and the second embodiment, sufficient threshold voltage characteristics are secured while controlling a doping concentration in a channel at a low level by applying the high work-function first barrier layer 209 to the lower buried portion 208 of the buried gate electrode 207. Herein, when titanium nitride containing aluminum is used as the first barrier layer 209, a dipole is formed based on the aluminum between the titanium nitride and the gate dielectric layer 206. With the dipole, high work function characteristics are obtained due to a change in energy band caused by interstitial oxygen.

Also, excellent gate-induced drain leakage (GIDL) characteristics are obtained by applying the low work-function second barrier layer 213 to the upper buried portion 212 of the buried gate electrode 207, while maintaining a doping concentration of a first impurity region 216 and a second impurity region 217 at a low level. Herein, a tungsten-based or titanium-based low work-function material is used as the second barrier layer 213. In this way, high-speed operation characteristics are obtained as well due to low-resistivity of the second barrier layer 213.

Also, a reaction between the first barrier layer 209 and the first low-resistivity layer 211 is prevented by the barrier enhancement layer 210. As a result, a variation in the work function of the first barrier layer 209 is suppressed.

The buried gate electrodes 207 in accordance with an embodiment are metal buried gate electrodes formed of metallic materials. Therefore, the buried gate electrode 207 has low resistance.

As a comparative example, an N-type polysilicon may be used as a low work-function layer, and a P-type polysilicon may be used as a high work-function layer. However, polysilicon increases resistance of a buried gate electrode.

Described hereafter is a method for fabricating a transistor in accordance with a first embodiment. FIGS. 4A to 4G exemplarily illustrate a method for fabricating a transistor in accordance with a first embodiment. FIGS. 4A to 4G are cross-sectional views of the transistor taken along a line A-A' of FIG. 1.

Figure 4A:
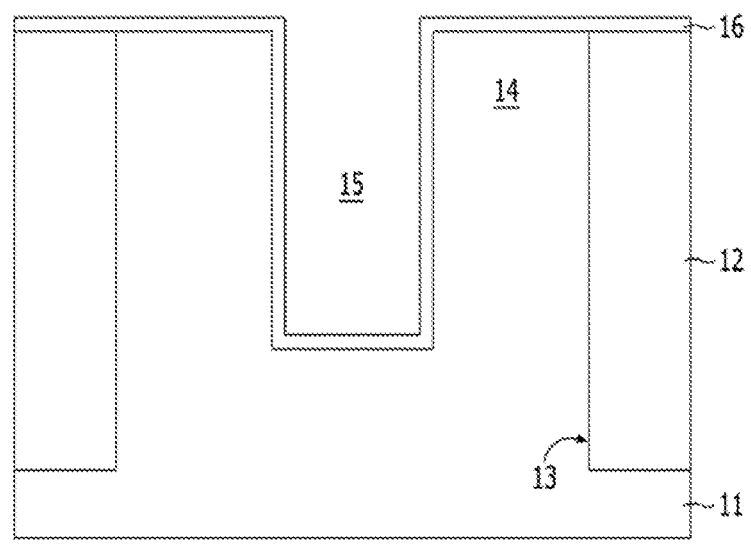
FIGS. 4A to 4G are cross-sectional views exemplarily illustrating a method for fabricating the transistor in accordance with the first embodiment.

Referring to FIG. 4A, an isolation layer 12 is formed in a substrate 11. The isolation layer 12 defines an active region 14. The isolation layer 12 may be formed by a Shallow Trench Isolation (STI) process. An isolation trench 13 may be formed by etching the substrate 11. The isolation trench 13 is filled with dielectric material, and as a result, the isolation layer 12 is formed. The isolation layer 12 may include wall oxide, a liner, and gap-fill dielectric material that are sequentially formed. A liner stack pattern may be formed by stacking a silicon nitride and a silicon oxide. Silicon nitride may include $Si_3N_4$, and silicon oxide may include $SiO_2$. The gap-fill dielectric material may include Spin-On Dielectric (SOD) material. According to another embodiment, silicon nitride may be used as the gap-fill dielectric material in the isolation layer 12.

Trenches 15 are formed in the substrate 11. Each of the trenches 15 may be formed in a shape of line crossing the active region 14 and the isolation layer 12. The trenches 15 may be formed by forming a mask pattern (not shown) over the substrate 11, using the mask pattern (not shown) as an etch mask, and performing an etch process. The trenches 15 may be formed to be shallower than the isolation trench 13.

A gate dielectric layer 16 is formed on the surface of the trenches 15. The gate dielectric layer 16 may be formed by a thermal oxidation process. According to another embodiment, the gate dielectric layer 16 may be formed by a Chemical Vapor Deposition (CVD) process or an Atomic Layer Deposition (ALD) process. The gate dielectric layer 16 may include high dielectric material, oxide, nitride, oxynitride, or a combination thereof. The high dielectric material may be dielectric material having a relatively higher dielectric constant than a dielectric constant of oxide or nitride. For example, the high dielectric material may include metal oxides, such as hafnium oxide and aluminum oxide.

Figure 4B:
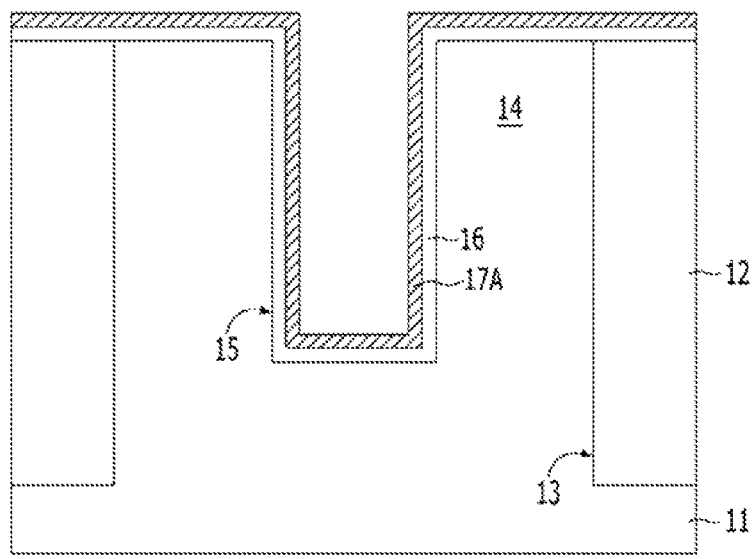

Referring to FIG. 4B, a preliminary first barrier layer 17A is formed over the gate dielectric layer 16. The preliminary first barrier layer 17A may be a liner pattern formed along a contour of a surface of the gate dielectric layer 16. The preliminary first barrier layer 17A has higher work function than the mid-gap work function (approximately 4.5 eV) of silicon. The preliminary first barrier layer 17A may be referred to as a high work function layer. The preliminary first barrier layer 17A may include aluminum-containing titanium nitride. The aluminum-containing titanium nitride may be referred to as titanium aluminum nitride (TiAlN) or aluminum-doped titanium nitride (Al-doped TiN). The aluminum-doped titanium nitride (Al-doped TiN) may be formed by depositing titanium nitride (TiN) and doping aluminum thereon by an aluminum implantation process. The titanium aluminum nitride (TiAlN) may be formed by adding aluminum-containing source material during a deposition process where titanium nitride (TiN) is deposited to dope aluminum in-situ. To take an example, when titanium nitride (TiN) is deposited by a Chemical Vapor Deposition (CVD) process, titanium source material, nitrogen-containing material, and aluminum source material are applied simultaneously.

Figure 4C:
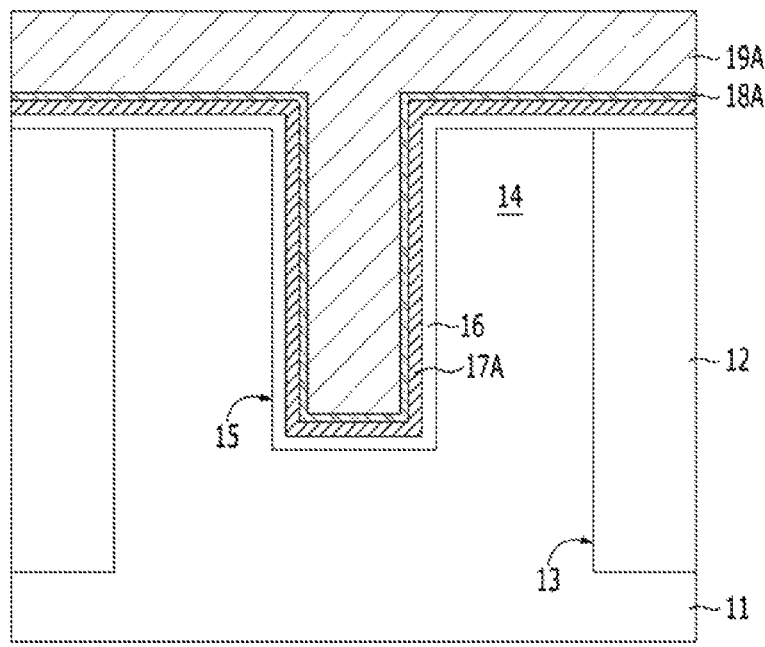

Referring to FIG. 4C, a preliminary barrier enhancement layer 18A is formed over the preliminary first barrier layer 17A. The preliminary barrier enhancement layer 18A may be a liner pattern formed along a contour of a surface of the preliminary first barrier layer 17A. The preliminary barrier enhancement layer 18A and the preliminary first barrier layer 17A may be different materials. The preliminary barrier enhancement layer 18A may be formed of a metal-containing material. The preliminary barrier enhancement layer 18A may include a metal nitride. For example, the preliminary barrier enhancement layer 18A may include a titanium nitride.

A preliminary first low-resistivity layer 19A is formed over the preliminary barrier enhancement layer 18A. The preliminary first low-resistivity layer 19A fills the trenches 15. The preliminary first low-resistivity layer 19A includes a low resistivity metal material. The preliminary first low-resistivity layer 19A may include tungsten. The preliminary first low-resistivity layer 19A may be formed by a Chemical Vapor Deposition (CVD) process or an Atomic Layer Deposition (ALD) process.

Figure 4D:
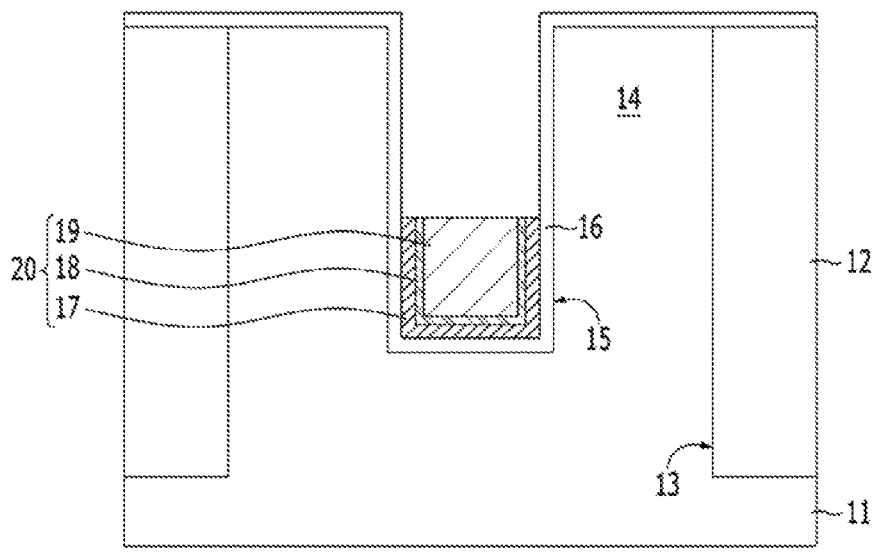

Referring to FIG. 4D, a first recessing process is performed, leaving the preliminary first barrier layer, the preliminary barrier enhancement layer, and the preliminary first low-resistivity layer in the trenches 15. The first recessing process may be performed by an etch-back process. As a result of the first recessing process, a first barrier layer 17, a barrier enhancement layer 18, and a first low-resistivity layer 19 are formed. The first barrier layer 17 is formed from an etch-back process of the preliminary first barrier layer 17A. The first low-resistivity layer 19 is formed from an etch-back process of the preliminary first low-resistivity layer 19A. The barrier enhancement layer 18 is formed from an etch-back process of the preliminary barrier enhancement layer 18A. A planarization process may be performed before the etch-back processes.

A lower buried portion 20 is formed as a result of the first recessing process. The lower buried portion 20 includes the first barrier layer 17, the barrier enhancement layer 18, and the first low-resistivity layer 19. The lower buried portion 20 is recessed such that an upper surface of the lower buried portion 20 is lower than an upper surface of the active region 14.

Figure 4E:
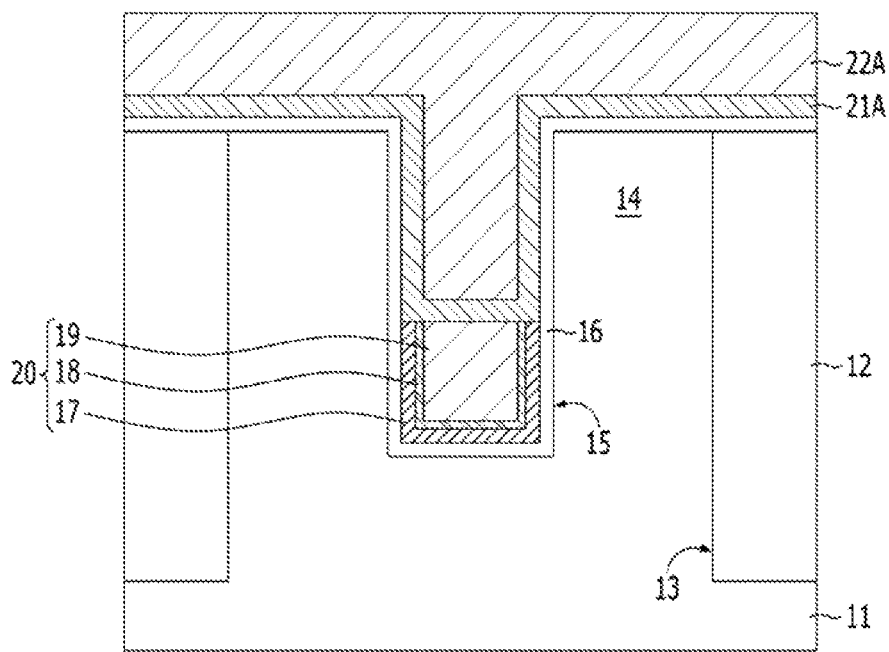

Referring to FIG. 4E, a preliminary second barrier layer 21A is formed. The preliminary second barrier layer 21A may be a liner pattern formed along a contour of the gate dielectric 16 and extending over a surface of the lower buried portion 20. The preliminary second barrier layer 21A includes low work-function material. The preliminary second barrier layer 21A may include low work-function metal-containing material. The preliminary second barrier layer 21A may include fluorine-free tungsten (FFW). According to another embodiment, the preliminary second barrier layer 21A may include fluorine-free tungsten carbide (FFWC), and the work function may be controlled by adjusting the carbon content. According to yet another embodiment, the second barrier layer 213 may include titanium aluminum (TiAl), titanium carbide (TiC), titanium aluminum carbide (TiAlC), or a combination thereof.

A preliminary second low-resistivity layer 22A is formed over the preliminary second barrier layer 21A. The preliminary second low-resistivity layer 22A fills a trench 15 over the lower buried portion 20. The preliminary second low-resistivity layer 22A includes low-resistivity metal material. The preliminary second low-resistivity layer 22A may include tungsten. The first low-resistivity layer 19 and the preliminary second low-resistivity layer 22A may be formed of the same material.

Figure 4F:
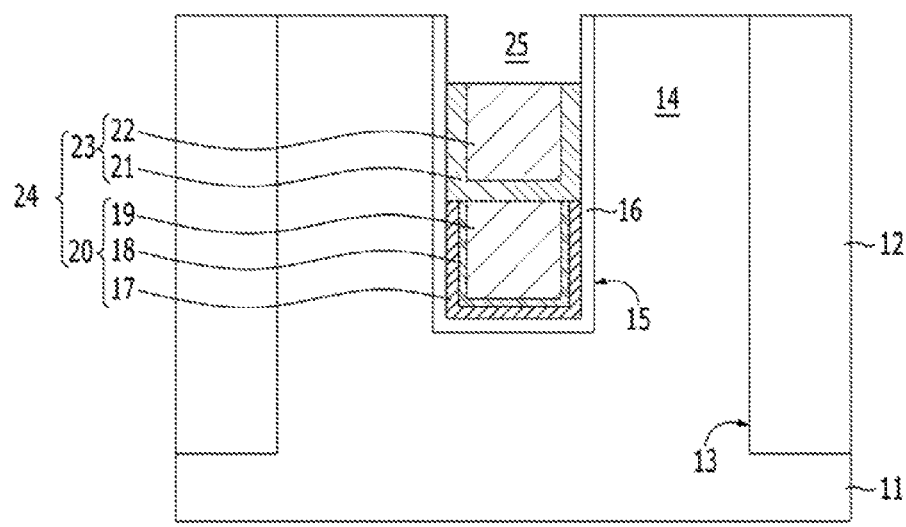

Referring to FIG. 4F, a second recessing process is performed, leaving the preliminary second barrier layer and the preliminary second low-resistivity layer in the trenches 15. The second recessing process may be performed by an etch-back process. As a result of the second recessing process, a second barrier layer 21 and a second low-resistivity layer 22 are formed. The second barrier layer 21 is formed by an etch-back process against the preliminary second barrier layer 21A. The second low-resistivity layer 22 is formed by an etch-back process against the preliminary second low-resistivity layer 22A. A planarization process may be performed before the etch-back processes.

An upper lower buried portion 23 is formed as a result of the second recessing process. The upper lower buried portion 23 includes the second barrier layer 21 and the second low-resistivity layer 22.

As a result of the first recessing process and the second recessing process, a buried gate electrode 24 is formed. The buried gate electrode 24 includes the lower buried portion 20 and the upper buried portion 23. Since it includes the first barrier layer 17 of a high work function and the second barrier layer 21 of a low work function, the buried gate electrode 24 may be called a dual work-function buried gate electrode.

An upper surface of the upper buried portion 23 of the buried gate electrode 24 is located at a level lower than an upper surface of the substrate 11. A space between the upper buried portion 23 of the buried gate electrode 24 and the surface of the substrate 11 is referred to as a recessed gap region 25.

Figure 4G:
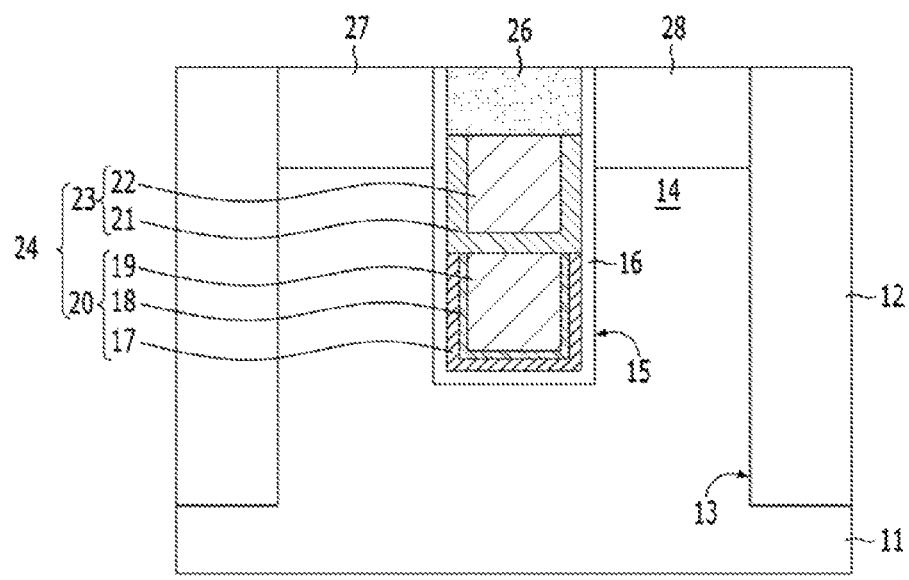

Referring to FIG. 4G, a capping layer 26 is formed over the buried gate electrode 24. The capping layer 26 includes dielectric material. The recessed gap region 25 is filled with the capping layer 26. The capping layer 26 may include silicon nitride. Subsequently, the capping layer 26 may be planarized to expose the surface of the substrate 11.

After the capping layer 26 is formed, an impurity doping process is performed by an implantation process or other doping processes. As a result, a first impurity region 27 and a second impurity region 28 are formed in the substrate 11. When the Impurity doping process is performed, the capping layer 26 is used as a barrier. The first impurity region 27 and the second impurity region 28 become a source region and a drain region, respectively.

Bottom surfaces of the first impurity region 27 and the second impurity region 28 may have a depth overlapping with the upper lower buried portion 23. Therefore, the second barrier layer 21 may have a portion that overlaps with the first and second impurity regions 27 and 28.

FIGS. 5A to 5E are cross-sectional views exemplarily illustrating a method for fabricating a transistor in accordance with a second embodiment. FIGS. 5A to 5E are cross-sectional views of the transistor taken along a line B-B' of FIG. 1.

Figure 5A:
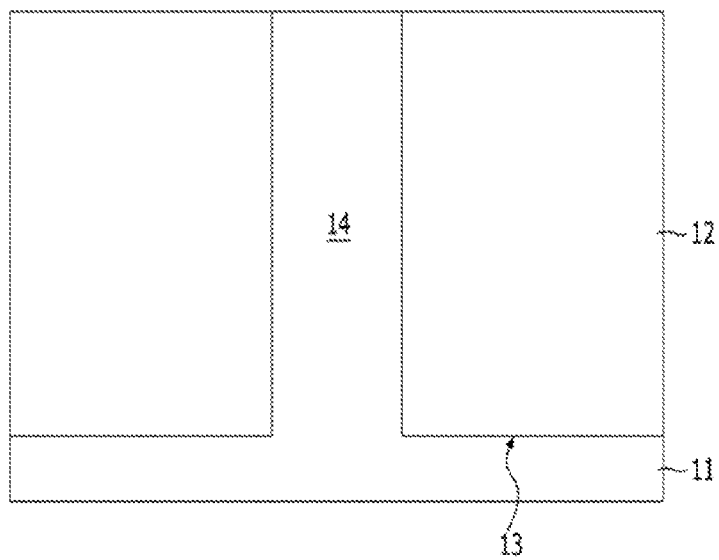
FIGS. 5A to 5E are cross-sectional views exemplarily illustrating a method for fabricating the transistor in accordance with the second embodiment.
Figure 5B:
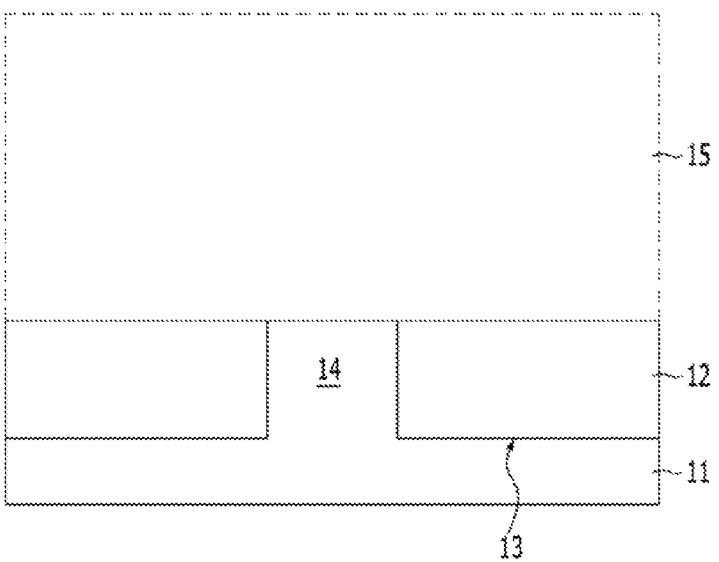

Referring to FIG. 5A, an Isolation layer 12 is formed over a substrate 11. The isolation layer 12 defines an active region 14. The isolation layer 12 may be formed by a Shallow Trench Isolation (STI) process.

Referring to FIG. 58, trenches 15 are formed in the substrate 11. Each of the trenches 15 may be formed in the shape of a line crossing the active region 14 and the isolation layer 12. The trenches may be formed by forming a mask pattern (not shown) over the substrate 11, using the mask pattern (not shown) as an etch mask, and performing an etch process. The trenches 15 may be formed to be shallower than the isolation trench 13.

Figure 5C:
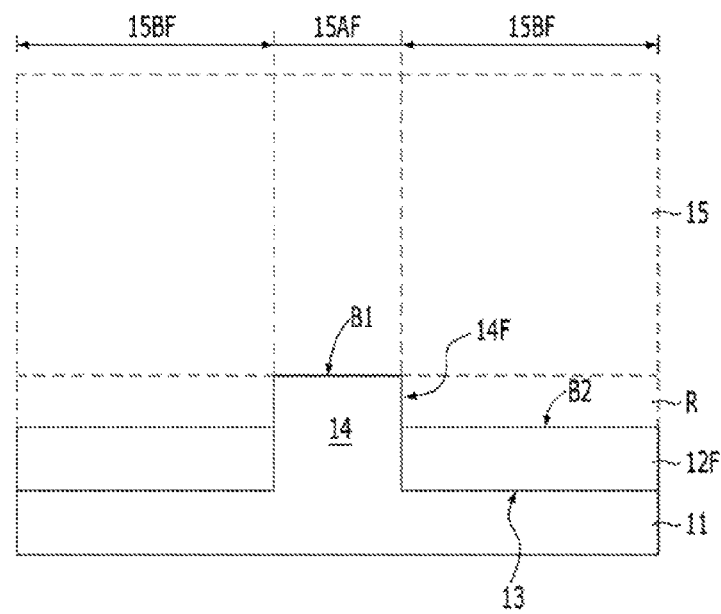

Referring to FIG. 5C, the isolation layer 12 is recessed to a predetermined depth. As a result, a recess region R is formed, and an upper portion of the active region 14 forms a fin region 14F due to the recess region R. A lower portion of the active region 14 except the fin region 14F is not exposed by the recessed isolation layer 12F. Each of the trenches 15 includes a first trench 15AF and a second trench 15BF. The first trench 15AF is formed in the active region 14. The second trench 15BF is formed in the isolation layer 12. The first trench 15AF and the second trench 15BF may be formed in continuum. In each trench 15, the first trench 15AF and the second trench 15BF may have bottom surfaces at different levels. For example, a bottom surface B1 of the first trench 15AF may be positioned higher than a bottom surface B2 of the second trench 15BF. The step difference between the first trench 15AF and the second trench 15BF is caused as the isolation layer 12 under the trenches 15 is recessed. The second trench 15BF includes the recess region R whose bottom surface B2 is lower than the bottom surface B1 of the first trench 15AF. Due to the step difference between the first trench 15AF and the second trench 15BF, the fin region 14F is formed in the active region 14.

Figure 5D:
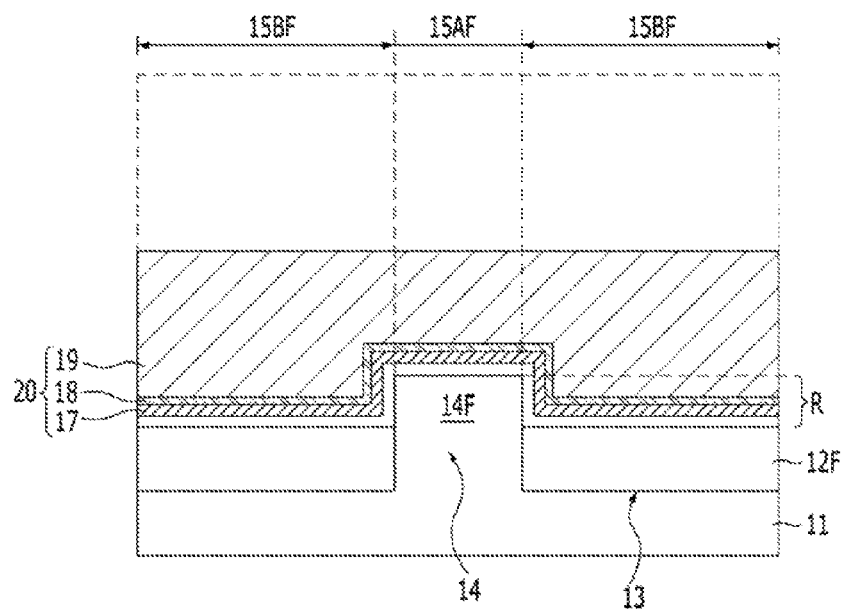

Referring to FIG. 5D, a gate dielectric layer 16 is formed over the fin region 14F. Subsequently, the same process as the fabrication method in accordance with the first embodiment may be performed. To be specific, a lower buried portion 20 is formed. The lower buried portion 20 includes a first barrier layer 17, a barrier enhancement layer 18, and a first low-resistivity layer 19. The first barrier layer 17 covers an upper portion and both sidewalls of the fin region 14F. Therefore, the fin region 14F is affected by a high work function of the first barrier layer 17.

Figure 5E:
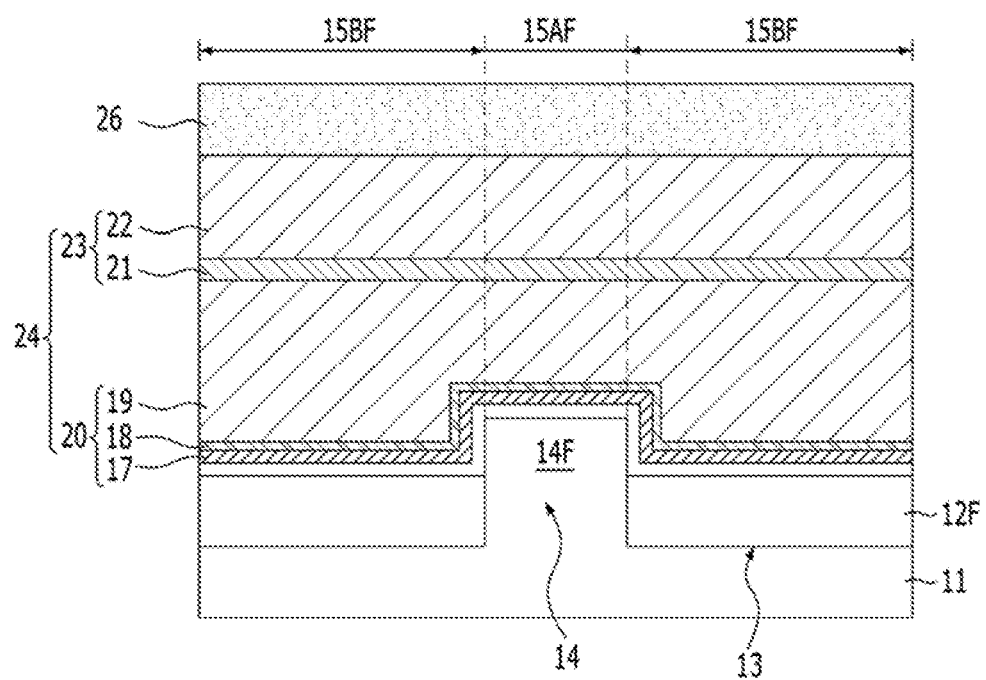

Referring to FIG. 5E, an upper lower buried portion 23 is formed over the lower buried portion 20. The upper lower buried portion 23 includes a second barrier layer 21 and a second low-resistivity layer 22. As a result, a buried gate electrode 24 including the lower buried portion 20 and the upper lower buried portion 23 is formed.

A capping layer 26 is formed over the lower buried portion 20.

Although not illustrated, a first impurity region 27 and a second impurity region 28 may be formed subsequently (see FIG. 4G).

Figure 6A:
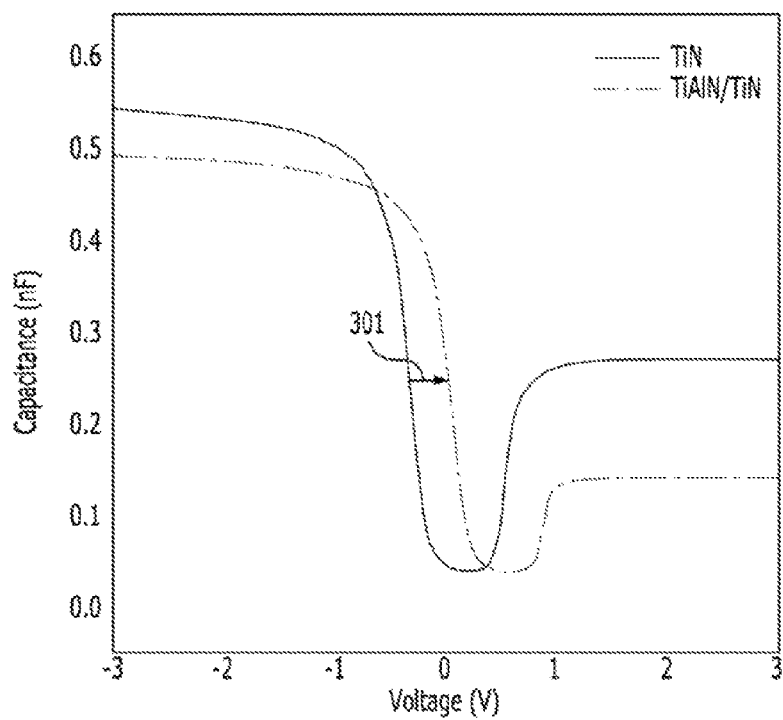
FIG. 6A is a graph comparing work functions of materials used as a first barrier layer.
Figure 6B:
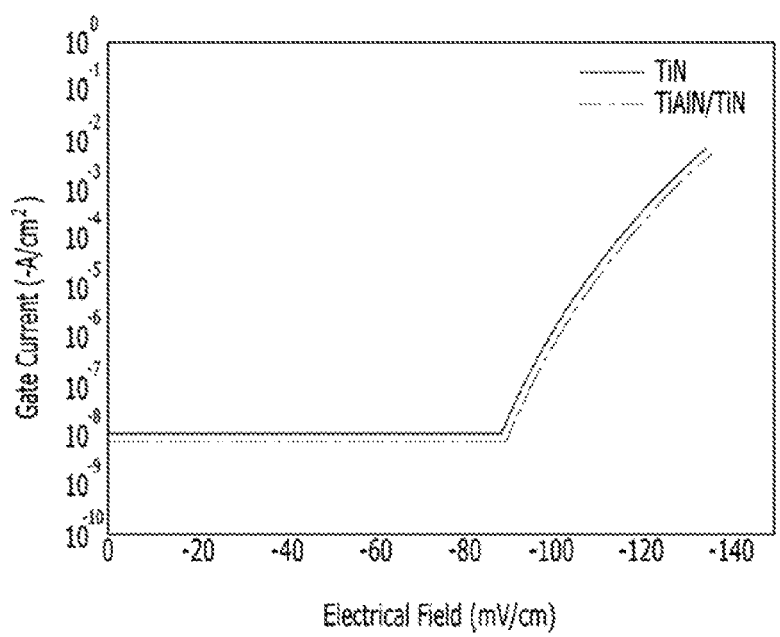
FIG. 6B is a graph comparing leakage currents of the materials used as the first barrier layer.

FIG. 6A is a graph comparing work functions of materials used as a first barrier layer. FIG. 6B is a graph comparing leakage currents of materials used as the first barrier layer. FIGS. 6A and 6B compare a first sample (TiN) and a second sample (TiAlN/TiN). The first sample is formed of titanium nitride alone, whereas the second sample is formed by stacking titanium aluminum nitride and titanium nitride. The lower buried portion of the buried gate electrode using the first sample may be TiN/W. The lower buried portion of the buried gate electrode using the second sample may be TiAlN/TiN/W.

Referring to FIG. 6A, when the second sample (TiAlN/TiN) is used, a flat band voltage is shifted toward a positive direction (see a reference numeral 301). In short, aluminum contained in titanium aluminum nitride (TiAlN) forms a dipole, which shifts the flat band voltage to a direction in which effective work function increases.

Referring to FIG. 68B, it may be seen that the first sample and the second sample have an equivalent level of leakage current.

It may be seen from FIGS. 6A and 6B, a buried gate electrode having a first barrier layer that includes titanium aluminum nitride (TiAlN) and titanium nitride (TiN) has a higher work function than a buried gate electrode having a first barrier layer that includes a titanium nitride (TiN).

Figure 7A:
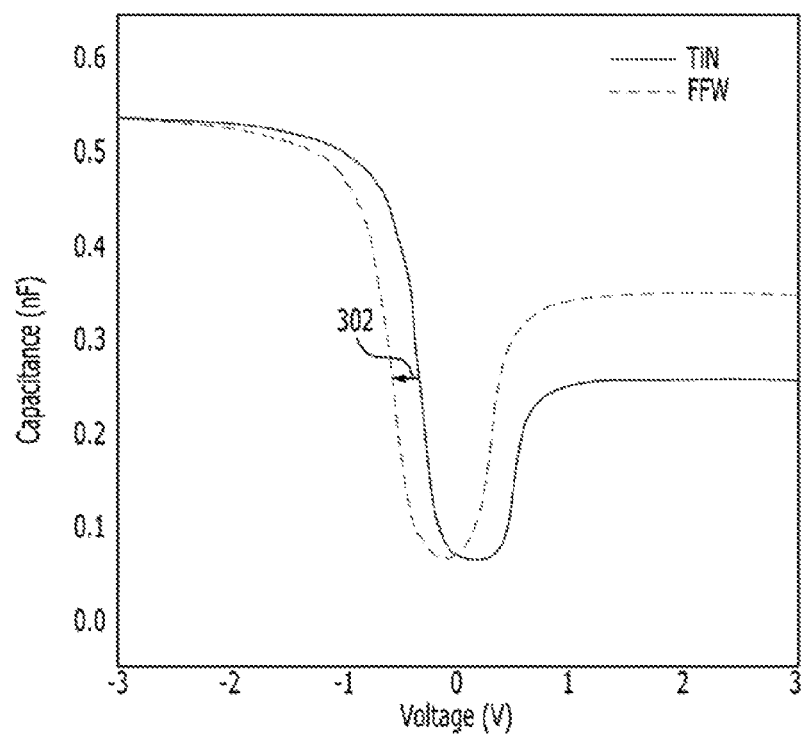
FIG. 7A is a graph comparing work functions of materials used as a second barrier layer.
Figure 7B:
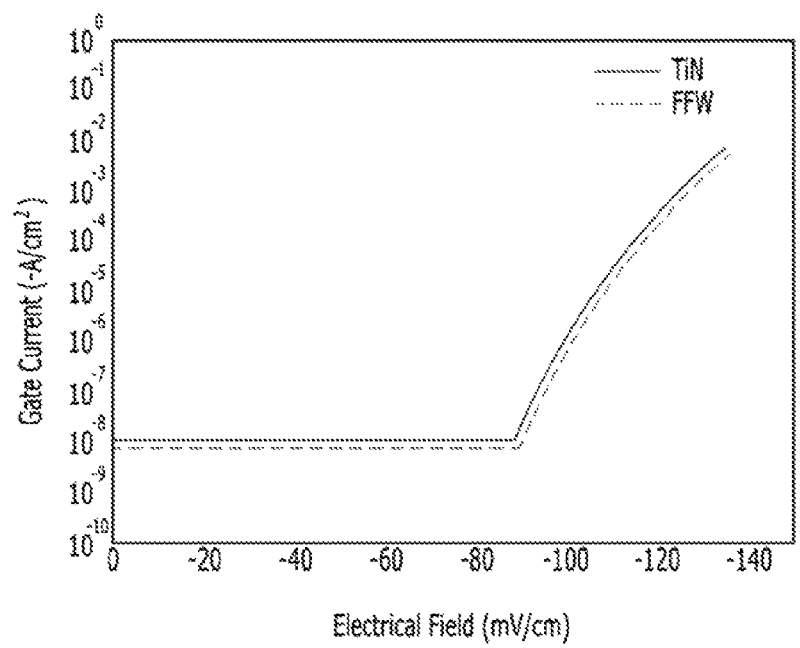
FIG. 7B is a graph comparing leakage currents of the materials used as the second barrier layer.

FIG. 7A is a graph comparing the work functions of materials used as a second barrier layer. FIG. 75 is a graph comparing leakage currents of materials used as the second barrier layer. FIGS. 7A and 7B compare a third sample (TiN) and a fourth sample (FFW). The upper buried portion of the buried gate electrode using the third sample may be TiN/W. The upper buried portion of the buried gate electrode using the fourth sample may be FFW/W.

Referring to FIG. 7A, when fluorine-free tungsten (FFW) is used, the flat band voltage is shifted toward a negative direction (see a reference numeral 302). In short, when the fluorine-free tungsten (FFW) is used, a low work function may be obtained.

Referring to FIG. 7B, it may be seen that titanium nitride (TiN) and fluorine-free tungsten (FFW) have substantially equivalent levels of leakage current.

It may be seen from FIGS. 7A and 78, a buried gate electrode having a second barrier layer that includes fluorine-free tungsten (FFW) has lower work function than a buried gate electrode having a second barrier layer that includes titanium nitride (TiN).

FIG. 8 is a cross-sectional view illustrating an example of a semiconductor device including a transistor in accordance with an embodiment.

Referring to FIG. 8, a semiconductor device 400 includes a first transistor 420 and a second transistor 440. The first transistor 420 and the second transistor 440 are formed in a substrate 401 and they are isolated from each other by an isolation layer 402.

The first transistor 420 includes a buried gate electrode 406, a first source region 415, and a first drain region 416. The buried gate electrode 406 is formed in a trench 403. The trench 403 extends across the isolation layer 402 and an active region 404. A first gate dielectric layer 405 is formed on the surface of the trench 403. The buried gate electrode 406 includes a lower buried portion 407 and an upper buried portion 411. The lower buried portion 407 includes a high work-function barrier layer 408, a barrier enhancement layer 409, and a first low-resistivity layer 410. The upper buried portion 411 includes a low work-function barrier layer 412 and a second low-resistivity layer 413.

The second transistor 440 includes a planar gate electrode 432, a second source region 433, and a second drain region 434. A second gate dielectric layer 431 is formed under the planar gate electrode 432. The planar gate electrode 432 may include polysilicon, metal, metal nitride, metal compound, or a combination thereof. The second gate dielectric layer 431 may include silicon oxide, silicon nitride, silicon oxynitride, or high k dielectric material. The high k dielectric material may include hafnium-based material. The second gate dielectric layer 431 may include a stack of an interface layer and a high dielectric material layer. The interface layer may include silicon oxide, silicon nitride, silicon oxynitride, or a combination thereof.

As described above, the semiconductor device 400 includes the first transistor 420 having the buried gate electrode 406 and the second transistor 440 having the planar gate electrode 432 that are integrated on one substrate 401. After the first transistor 420 is formed, the second transistor 440 may be formed.

In the semiconductor device 400, the first transistor 420 and the second transistor 440 may all be NMOSFETs.

The semiconductor device 400 may be a CMOSFET. For example, the first transistor 420 may be an NMOSFET, while the second transistor 440 may be a PMOSFET. In case of the PMOSFET, P-type work-function material may serve the planar gate electrode 432.

The first transistor 420 is referred to as a buried gate-type transistor, and the second transistor 440 is referred to as a planar gate-type transistor. The planar gate-type transistor is one example of non-buried gate-type transistors. Another example of the non-buried gate-type transistors is a general fin-type transistor. The general fin-type transistor is different from a buried gate-type fin channel transistor. In the general fin-type transistor, a fin region is formed by recessing an isolation layer alone without forming trenches and making active regions protrude. Also, the general fin-type transistor may form the fin regions by etching active regions.

In the semiconductor device 400, the first transistor 420 may serve as a transistor provided in a memory cell, while the second transistor 440 may serve as a transistor provided in a peripheral circuit region.

As described above, gate-induced drain leakage (GIDL) may be reduced as well as decreasing gate resistance by forming the buried gate electrode 406 which includes the high work-function barrier layer 408 and the low work-function barrier layer 412, and forming the low work-function barrier layer 412 to overlap with the first source region 415 and the first drain region 416.

According to an embodiment, performance of the semiconductor device 400 may be improved.

Figure 9:
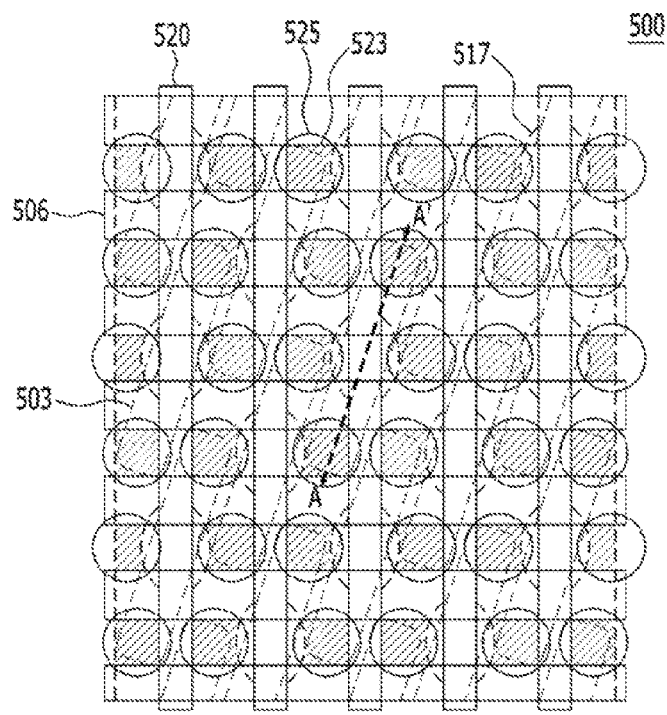
FIG. 9 is a plan view illustrating another example of a semiconductor device including a buried gate-type transistor in accordance with an embodiment.
Figure 10:
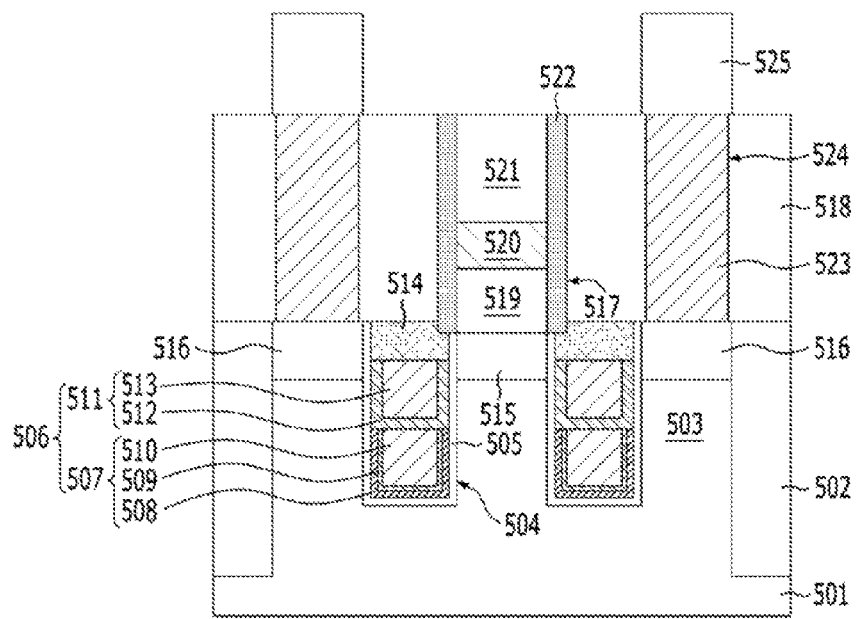
FIG. 10 is a cross-sectional view of the semiconductor device taken along a line A-A' of FIG. 9.

FIG. 9 is a plan view illustrating another example of a semiconductor device including a buried gate-type transistor in accordance with an embodiment. FIG. 9 shows a memory cell array of the semiconductor device. FIG. 10 is a cross-sectional view of the semiconductor device taken along a line A-A' of FIG. 9.

Referring to FIGS. 9 and 10, the memory cell array 500 includes a plurality of buried word lines 506, a plurality of bit lines 520 that are extended in a direction crossing the buried word lines 506, and a plurality of memory elements 525.

Hereafter, the memory cell array 500 is described in detail.

An isolation layer 502 is formed in a substrate 501. The isolation layer 502 defines a plurality of active regions 503. Gate trenches 504 crossing the active regions 503 are formed. A gate dielectric layer 505 is formed on the surface of the gate trenches 504.

The buried word lines 506 filling a portion of each gate trench 504 are formed over the gate dielectric layer 505. Each of the buried word lines 506 includes a lower buried portion 507 and an upper buried portion 511. The lower buried portion 507 includes a high work-function barrier layer 508, a barrier enhancement layer 509, and a first low-resistivity layer 510. The upper buried portion 511 includes a low work-function barrier layer 512 and a second low-resistivity layer 513. The buried word lines 506 have the same structure as the buried gate electrode 207 in accordance with the first embodiment. According to another embodiment, fin regions may be further formed under the buried word lines 506 similarly to the second embodiment.

A capping layer 514 is formed over the buried word lines 506. A first impurity region 515 and a second impurity region 516 are formed in the substrate 501 on both sides of each of the buried word lines 506. The buried word line 506, the first impurity region 515, and the second impurity region 516 may form a buried gate-type transistor.

Bit line structures that are electrically connected to the first impurity regions 515 may be formed. The bit line structures include the bit lines 520 and a bit line hard mask layer 521. Each of the bit line structures may further include a first contact plug 519 between one bit line 520 and one first impurity region 515. Spacers 522 are formed on the sidewall of each bit line structure. A plug isolation layer 518 is formed over the substrate 501. First contact plugs 519 may be formed in first contact holes 517. The first contact plugs 519 are electrically connected to the first impurity regions 515, respectively. The diameter of each of the first contact holes 517 may be narrower than a line width of each of the bit lines 520. The first contact plugs 519 and the bit lines 520 may have the same line width. Therefore, a gap exists between the first contact plug 519 and the sidewalls of the first contact hole 517, and spacers 522 are extended to fill the gap. Surfaces of the first impurity regions 515 may be recessed. As a result, the contact areas between the first contact plugs 519 and the first impurity regions 515 are increased. The bit lines 520 may have a shape of lines and extend in a direction crossing a direction that the buried word lines 506 are extended. The bit lines 520 may include polysilicon, metal silicide, metal nitride, and metal. The bit line hard mask layer 521 may include silicon oxide or silicon nitride. The first contact plugs 519 may include polysilicon, metal silicide, metal nitride, and metal.

The spacers 522 include dielectric material. The spacers 522 may include silicon oxide, silicon nitride, or a combination of silicon oxide and silicon nitride. The spacers 522 may be multi-layered spacers. For example, the spacers 522 may have a stack structure of silicon nitride/silicon oxide/silicon nitride (NON). The spacers 522 each may have an air gap-embedded multi-spacer structure.

Memory elements 525 may be formed over the second impurity region 516. Second contact plugs 523 may be formed between the memory elements 525 and the second impurity regions 516. Also, second contact holes 524 penetrating the plug isolation layer 518 are formed, and the second contact plugs 523 may be formed in the second contact holes 524. The second contact plugs 523 are electrically connected to the second impurity regions 516. The second contact plugs 523 may include polysilicon, metal, metal silicide, and metal nitride. For example, the second contact plugs 523 may include a plug structure where polysilicon, metal silicide, and metal are stacked.

A plug isolation layer 518 may be a single layer or a multi-layer. The plug isolation layer 518 may include silicon oxide, silicon nitride, silicon oxynitride, or a combination thereof. The plug isolation layer 518 may be formed through a Damascene process. The plug isolation layer 518 isolates neighboring second contact plugs 523 from each other. According to another embodiment, contact spacers (not shown) surrounding sidewalls of the second contact plugs 523 may be further formed. The contact spacers (not shown) each may have an air gap-embedded multi-spacer structure. In another embodiment, no air gap may be formed in the spacers 522. Upper surfaces of the plug isolation layer 518 and the bit line structures may be positioned at the same level.

According to another embodiment, third contact plugs (not shown) may be further formed over the second contact plugs 523. The third contact plugs (not shown) may be formed to overlap with the bit line structures and the second contact plugs 523. The third contact plugs (not shown) may include conductive material such as metal.

The memory elements 525 that are electrically connected to the second contact plugs 523 may be formed over the second contact plugs 523. The memory elements 525 may be formed in diverse forms.

The memory elements 525 may be capacitors. In this case, the memory elements 525 may include storage nodes that contact with the second contact plugs 523. The storage nodes may have a cylindrical shape or a pillar shape. A capacitor dielectric layer may be formed on a surface of each of the storage nodes. The capacitor dielectric layer may include zirconium oxide, aluminum oxide, hafnium oxide, etc. For example, the capacitor dielectric layer may have a ZAZ structure including a stack of first zirconium oxide, aluminum oxide, and second zirconium oxide. A plate node is formed over the capacitor dielectric layer. The storage nodes and the plate node may include metal-containing material.

The memory elements 525 each may include a variable resistor. The variable resistor may include phase-change material. The phase-change material may include a chalcogenide element, e.g., tellurium (Te) or selenium (Se). According to another embodiment, the variable resistor may include transition metal oxide. According to yet another embodiment, the variable resistor may include a magnetic tunnel junction (MT)).

As described above, gate-induced drain leakage (GIDL) may be reduced in addition to decreasing gate resistance by forming the buried word lines 506 which include the high work-function barrier layer 508 and the low work-function barrier layer 512, and forming the low work-function barrier layer 512 to overlap with the first impurity regions 515 and the second impurity regions 516.

According to an embodiment, data retention time is protected from being dropped and thus refresh characteristics of the memory cell array 500 may be improved.

Transistors in accordance with an embodiment may be integrated into a transistor circuit. Also, a transistor in accordance with an embodiment may be applied to an integrated circuit which serves for diverse purposes. For example, a transistor in accordance with an embodiment may be applied to an integrated circuit including an Insulated Gate FET (IGFET), a High-Electron Mobility Transistor (HEMT), a power transistor, and a Thin Film Transistor (TFT).

A transistor and an integrated circuit in accordance with an embodiment may be mounted on an electronic device. The electronic device may include a memory device and a non-memory device. The memory device may include a Static Random Access Memory (SRAM), a Dynamic Random Access Memory (DRAM), a flash memory, a Magnetic Random Access Memory (MRAM), a Resistive Random Access Memory (ReRAM), a Spin Transfer Torque Random Access Memory (STTRAM), a Ferroelectric Random Access Memory (FeRAM) and the like. The non-memory device includes a logic circuit. A logic circuit may include a sense amplifier, a decoder, input/output circuits which control the memory device, etc. Also, the logic circuit may include diverse integrated circuits (IC). For example, the logic circuit may include a micro-processor, an application processor of a mobile device, etc. Also, the non-memory device includes a logic gate such as a NAND gate, a driver IC for a display device, and a power semiconductor device such as a Power Management IC (PMIC). The electronic device may include a computing system, an image sensor, a camera, a mobile device, a display device, a sensor, a medical device, a photoelectronic device, a Radio Frequency Identification (RFID) device, a solar battery, a semiconductor device for automobiles, a semiconductor device for railway vehicles, and a semiconductor device for aircraft.

Described hereafter are diverse application examples including a transistor in accordance with an embodiment.

Figure 11A:
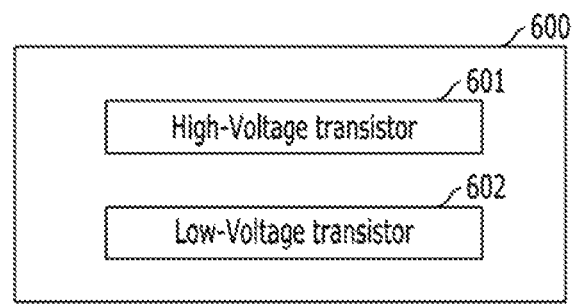
FIGS. 11A to 11C show diverse application examples of an integrated circuit including a transistor in accordance with an embodiment.
Figure 11B:
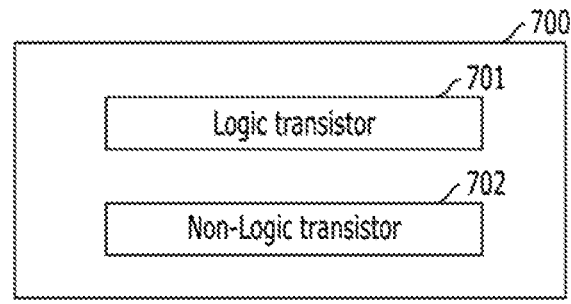
Figure 11C:
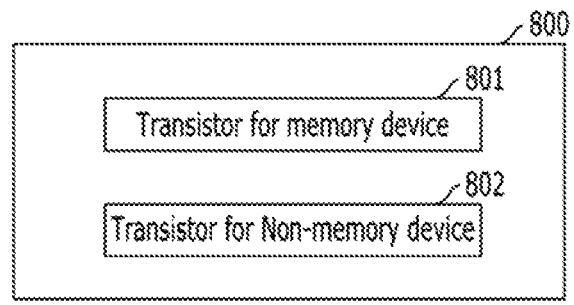

FIGS. 11A to 11C show diverse application examples of an integrated circuit including a transistor in accordance with an embodiment.

An integrated circuit 600 illustrated in FIG. 11A includes a plurality of high-voltage transistors 601 and a plurality of low-voltage transistors 602.

An integrated circuit 700 illustrated in FIG. 118 includes a plurality of logic transistors 701 and a plurality of non-logic transistors 702.

An integrated circuit 800 illustrated in FIG. 11C includes a transistor 801 for a memory device and a transistor 802 for a non-memory device.

The above-described high-voltage transistors 601, the low-voltage transistors 602, the logic transistors 701, the non-logic transistors 702, the transistor 801 for a memory device, and the transistor 802 for a non-memory device may include the buried gate-type transistor in accordance with an above-mentioned embodiment. The buried gate-type transistor included in the integrated circuits 600, 700 and 800 includes buried gate electrodes that are formed in trenches. The buried gate electrodes include dual work function buried gate electrodes. A buried gate electrode includes a lower buried portion, which includes a high work-function barrier layer and a first low-resistivity layer, and an upper buried portion, which includes a low work-function barrier layer and a second low-resistivity layer. The low work-function barrier layer overlaps with a source region and a drain region. As a result, Gate-Induced Drain Leakage (GIDL) characteristics are improved.

Therefore, it is possible to improve the performance of the Integrated circuits 600, 700 and 800.

Figure 12:
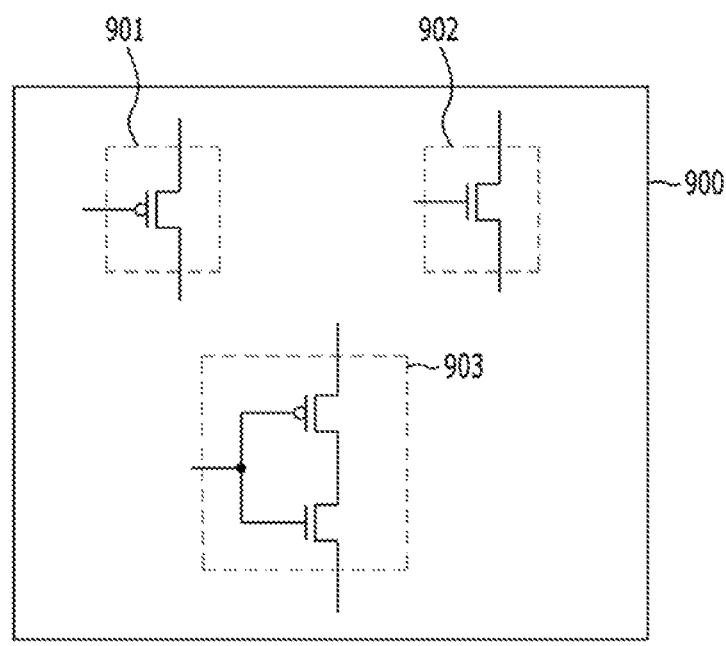
FIG. 12 illustrates an electronic device including a transistor in accordance with an embodiment.

FIG. 12 illustrates an electronic device including transistors in accordance with an embodiment.

Referring to FIG. 12, an electronic device 900 includes a plurality of transistors. The electronic device 900 may include a plurality of PMOSFETs 901, a plurality of NMOSFETs 902, and a plurality of CMOSFETs 903. One or more of the PMOSFETs 901, NMOSFETs 902, and CMOSFETs 903 may include a buried gate-type transistor in accordance with an embodiment. A buried gate-type transistor included in the electronic device 900 includes buried gate electrodes that are formed in trenches. A buried gate electrode includes a lower buried portion, which includes a high work-function barrier layer and a first low-resistivity layer, and an upper buried portion, which includes a low work-function barrier layer and a second low-resistivity layer. The low work-function barrier layer overlaps with a source region and a drain region. Accordingly, Gate-Induced Drain Leakage (GIDL) characteristics improve. Therefore, the electronic device 900 may have fast operation speed and be fabricated in a small area.

According to an embodiment, it is possible to improve current driving capability of a buried gate-type transistor and decrease gate-induced drain leakage (GIDL) by forming a low work function barrier layer between a buried gate electrode and a source region/drain region.

According to an embodiment, since a lower buried portion of a buried gate electrode is formed to include a high work function layer containing aluminum (Al), an impurity doping dose to a channel may be reduced by the high work function layer.

What is claimed is:

1. A method for fabricating a transistor, comprising:
forming an isolation layer that defines an active region in a substrate;
forming a trench extending across the active region and the isolation layer;
forming a fin region by recessing the isolation layer, after the forming of the trench;
forming a lower buried gate electrode that includes a high work-function barrier layer disposed on a bottom and sidewalls of the trench and fills a portion of the trench;
forming an upper buried gate electrode over the lower buried gate electrode, wherein the upper buried gate electrode includes a low work-function barrier layer and fills a portion of the trench;
forming a capping layer over the upper buried gate electrode; and
forming a source region and a drain region that are spaced apart from each other by the trench in the substrate and each have a depth overlapping with the low work-function barrier layer.

2. The method of claim 1, wherein the high work-function barrier layer includes titanium aluminum nitride (TiAlN).

3. The method of claim 1, wherein the low work-function barrier layer includes fluorine-free tungsten (FFW), a titanium carbide (TiC), a titanium aluminum carbide (TiAlC), a titanium aluminum (TiAl), or a combination thereof.

4. The method of claim 1, wherein the forming of the lower buried gate electrode includes:
   forming titanium aluminum nitride (TiAlN) as the high work-function barrier layer;
   forming titanium nitride (TiN) over the titanium aluminum nitride (TiAlN);
   forming a tungsten layer that fills the trench over the titanium nitride (TiN); and
   recessing the titanium aluminum nitride (TiAlN), the titanium nitride (TiN), and the tungsten layer.

5. The method of claim 1, wherein the forming of the upper buried gate electrode includes:
   forming a fluorine-free tungsten (FFW) layer as the low work-function barrier layer over the profile of the substrate including the lower buried gate electrode;
   forming a tungsten layer that fills the trench over the fluorine-free tungsten (FFW) layer; and
   recessing the fluorine-free tungsten (FFW) layer and the tungsten layer.

\* \* \* \* \*